United States Patent [19]
Nishihori et al.

[11] Patent Number: 5,273,937
[45] Date of Patent: Dec. 28, 1993

[54] METAL SEMICONDUCTOR DEVICE AND METHOD FOR PRODUCING THE SAME

[75] Inventors: Kazuya Nishihori, Tokyo; Tomotoshi Inoue, Kawasaki; Kenichi Tomita, Yokohama; Hitoshi Mikami, Kawasaki; Masami Nagaoka, Yokohama; Naotaka Uchitomi, Machida, all of Japan

[73] Assignee: Kabushiki Kaisha Toshiba, Kawasaki, Japan

[21] Appl. No.: 774,169

[22] Filed: Oct. 15, 1991

Related U.S. Application Data

[63] Continuation of Ser. No. 294,648, Jan. 9, 1989, abandoned.

Foreign Application Priority Data

Jan. 8, 1988 [JP] Japan ................ 63-1331
Nov. 22, 1988 [JP] Japan ............ 63-293564

[51] Int. Cl.$^5$ .................................. H01L 21/283
[52] U.S. Cl. ................... 437/184; 437/247; 437/912; 437/192
[58] Field of Search ............. 357/15, 107, 71; 437/187, 188, 39, 40, 912, 161, 176–179, 184, 192, 247; 148/DIG. 80

[56] References Cited

U.S. PATENT DOCUMENTS

| | | | |
|---|---|---|---|
| 2,785,095 | 4/1953 | Pankove | 437/161 |
| 4,489,481 | 12/1984 | Jones | 437/187 |
| 4,574,298 | 3/1986 | Yamagishi et al. | 357/71 |
| 4,782,031 | 11/1988 | Hagio et al. | 437/912 |
| 4,823,172 | 4/1989 | Mihara | 357/15 |
| 4,843,033 | 6/1989 | Plumton et al. | 437/178 |
| 4,857,975 | 8/1989 | Hirayama | 357/22 |
| 4,895,811 | 1/1990 | Inoue | 357/15 |
| 4,910,578 | 3/1990 | Okamote | 357/67 |
| 4,912,542 | 3/1990 | Suguro | 357/67 |
| 4,937,652 | 6/1990 | Okumura et al. | 357/67 |
| 5,143,856 | 9/1992 | Iwasaki | 437/177 |

FOREIGN PATENT DOCUMENTS

| | | | |
|---|---|---|---|
| 59-222965 | 12/1984 | Japan | 437/912 |
| 60-189968 | 9/1985 | Japan | 357/67 |
| 60-213065 | 10/1985 | Japan | 437/176 |
| 61-187364 | 8/1986 | Japan | 357/71 |
| 63-111666 | 5/1988 | Japan | 357/67 |
| 63-173375 | 7/1988 | Japan | 357/15 |

OTHER PUBLICATIONS

Uchitomi et al., "Properties of WNX films deposited by reactive sputtering for self-aligned gate GaAs Mesfets," Workshop on Refractory Metals & Silicides for VLSI IV, May 1986.

*Primary Examiner*—Olik Chaudhuri
*Assistant Examiner*—Richard A. Booth
*Attorney, Agent, or Firm*—Foley & Lardner

[57] ABSTRACT

A metal semiconductor device, in which an electrode is formed on a semiconductor substrate to form a Schottky junction therebetween, and the electrode has an oxide film having a first thickness on its upper surface and a non-oxidized portion having a second thickness from the Schottky junction. A method for producing the metal semiconductor device is also disclosed, in which a conductor layer formed on the semiconductor substrate is oxidized in a gas containing oxygen, and a capless annealing of the semiconductor substrate having the oxidized conductor layer thereon is conducted in an atmosphere containing arsenic.

34 Claims, 4 Drawing Sheets

PRIOR ART

METAL SEMICONDUCTOR DEVICE AND METHOD FOR PRODUCING THE SAME

This application is a continuation of application Ser. No. 07/294,648, filed Jan. 9, 1989 now abandoned.

BACKGROUND OF THE INVENTION

1. Field of the Invention

The present invention relates to a metal semiconductor device such as a GaAs metal semiconductor field effect transistor (MESFET) and a method for producing the same.

2. Description of the Background Art

Nowadays, in a supercomputer or a high frequency communications apparatus, high-speed field-effect transistors (FETs) employing a metal-semiconductor substrate such as GaAs, InP or the like having a double to several times higher electron mobility than that of silicon (Si) at the normal temperature, are frequently used. In these FETs, a Schottky gate type GaAs metal-semiconductor field-effect transistor (MESFET) is known. A conventional manufacturing process of this GaAs MESFET is schematically shown in FIG. 1.

In FIG. 1a, an active region $11_1$ is formed on a semi-insulating GaAs substrate 10 by an ion implantation and a heat treatment for activating it.

Then, in FIG. 1b, a tungsten nitride (WNx) film is deposited on the entire surface of the substrate 10 including the active region $11_1$ by, for example, a sputtering, and the WNx film is selectively etched to form a gate electrode 12 on the active region $11_1$. The film deposited by the sputtering is a polycrystal composed of crystal grains $12_1$ with crystal grain boundaries $12_2$ therebetween. There exist gaps in the crystal grain boundaries $12_2$ between the crystal grains $12_1$. Similarly, there are crystal grain boundaries with gaps in a polycrystalline tungsten nitride film, molybdenum nitride film, iridium nitride film, tungsten silicide film, molybdenum silicide film or nitride, silicide or siliconitride film of a high melting point metal such as tungsten siliconitride or the like formed by a CVD method or an EB evaporation method.

In FIG. 1c, by using a resist having open windows and the gate electrode 12 as masks, impurity doping regions $13_1$ and $14_1$ to be source and drain regions are formed in both side portions of the gate electrode 12 by an impurity implantation.

In FIG. 1d, after removing the resist, while using an arsine (AsH₃) atmosphere with a high pressure so as to restraining the release of arsenic (As) having a high vapor pressure from the substrate, the impurity doping regions $13_1$ and $14_1$ are activated by, e.g., a capless annealling at a temperature of approximately 820° C. to form respective source and drain regions $13_2$ and $14_2$ which self-aligns to the gate electrode 12. At the same time, the active region $11_1$ is converted to a channel region $11_2$ connecting the source and drain regions $13_2$ and $14_2$.

The capless annealing for use in this embodiment, which is different from another capless annealing to be carried out when a thick insulating film is formed on the entire surface of the substrate including the gate electrode 12, is a superior annealing method which imparts no stress to the gate electrode 12 and the surface of the substrate 12 during the high temperature thermal treatment.

However, in such a capless annealling, although a high pressure is applied to the atmosphere during the thermal treatment so that the arsenic does not release from the substrate in conformity with the phase equilibrium of the semiconductor region (except the gate electrode region) directly exposing to the atmosphere, the phase equilibrium of the semiconductor region having the gate electrode 12 thereon is different from that of the region directly exposing to the atmosphere. Accordingly, the elements such as As having a high vapor pressure in the channel region $11_2$ can readily release to the atmosphere through the crystal grain boundaries $12_2$ depending on the heat treatment conditions such as pressure, temperature and so forth.

As a result, the crystallization of the channel region $11_2$ of the interface between the channel region $11_2$ and the gate electrode 12 is disordered, and thus the Schottky characteristics between the channel region $11_2$ and the gate electrode 12 are deteriorated, as well as a threshold voltage dispersion is caused. As explained above, in the capless annealing, it is difficult to conduct the thermal treatment of the region having the gate electrode and the region having no gate electrode at the same time.

SUMMARY OF THE INVENTION

Accordingly it is an object of the present invention to provide a metal semiconductor device such as a metal semiconductor field-effect transistor (MESFET), free from the aforementioned defects and drawbacks of the prior art, which is capable of providing uniform characteristics and a high reliability without reducing or deteriorating Schottky characteristics of a Schottky junction.

It is another object of the present invention to provide a method for producing a metal semiconductor device such as an MESFET, free from the aforementioned defects and drawbacks of the prior art, which is capable of obtaining uniform characteristics during a thermal treatment, and providing a high reliability without reducing or deteriorating Schottky characteristics of a Schottky junction.

In accordance with one aspect of the present invention, there is provided a metal semiconductor device, comprising a semiconductor substrate, and an electrode formed on the semiconductor substrate to form a Schottky junction therebetween, the electrode having an oxide film having a first thickness on its upper surface, and a non oxidized portion having a second thickness from the Schottky junction.

In accordance with another aspect of the present invention, there is provided a method for producing a metal semiconductor device, comprising the steps of forming a conductor layer on a semiconductor substrate to form a Schottky junction therebetween, oxidizing the conductor layer in a gas containing oxygen, and conducting a capless annealing of the semiconductor substrate having the oxidized conductor layer thereon in an atmosphere containing arsenic.

BRIEF DESCRIPTION OF THE DRAWINGS

These and other objects, features and advantages of the present invention will be more fully apparent from the following description of the preferred embodiments with reference to the accompanying drawings, in which.

DESCRIPTION OF THE PREFERRED EMBODIMENTS

Figure 1A:
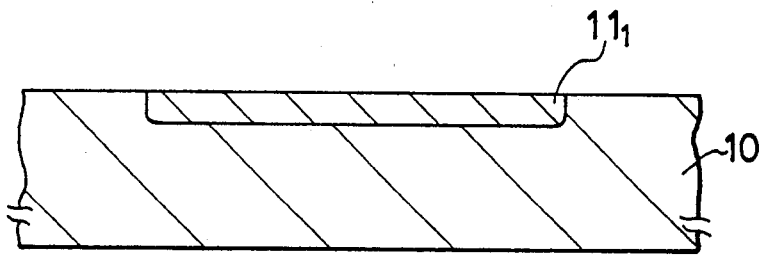
FIGS. 1(a)-1(d) are cross sectional views showing a conventional process for producing a conventional GaAs metal-semiconductor field-effect transistor (MESFET)
Figure 1B:
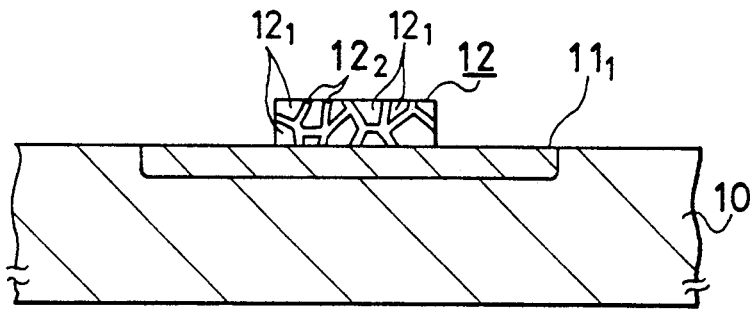
Figure 1C:
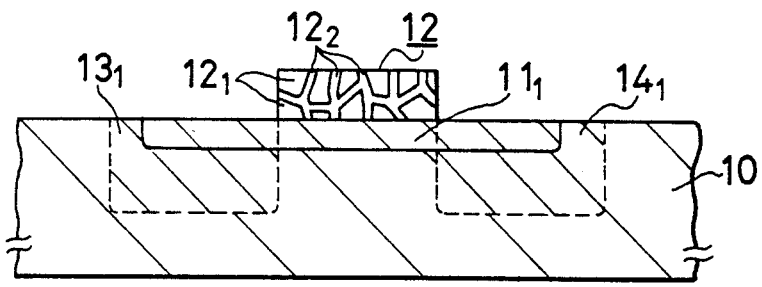
Figure 1D:
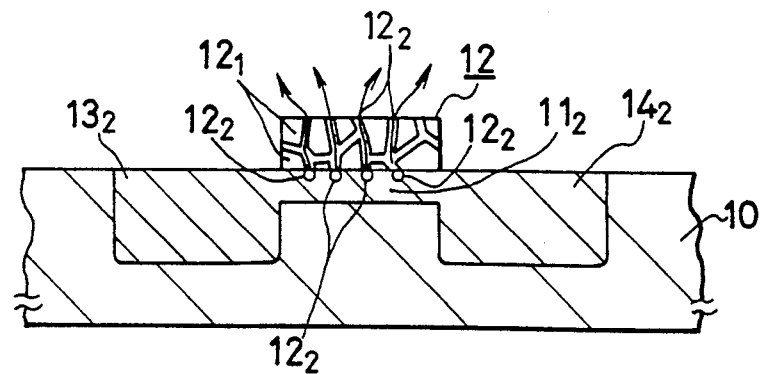

Referring now to the drawings, wherein like reference characters designate like or corresponding parts throughout the several views, there is shown in FIG. 2 one embodiment of a method for producing a metal-semiconductor device such as a GaAs metal-semiconductor field-effect transistor (MESFET) according to the present invention.

Figure 2A:
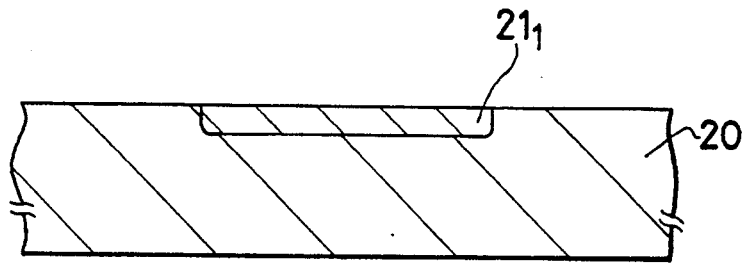
FIGS. 2(a)-2(s) are cross sectional views showing one embodiment of a method for producing a GaAs MESFET according to the present invention.

In FIG. 2a, firstly, a resist mask is mounted on a semi-insulating GaAs substrate 20, and a silicon (Si) ion implantation is carried out into the GaAs substrate 20 at 50 keV energy with a dose of $2 \times 10^{12}/cm^2$. Then, the resist mask is removed, and a thermal treatment of the substrate 20 for activating it is conducted, for instance, in one atm of a mixture gas atmosphere of arsine (AsH$_3$) and argon (Ar) at a temperature of approximately 820° C. for 20 minutes to form an n-type active region $21_1$ in the surface portion of the substrate 20.

Figure 2B:
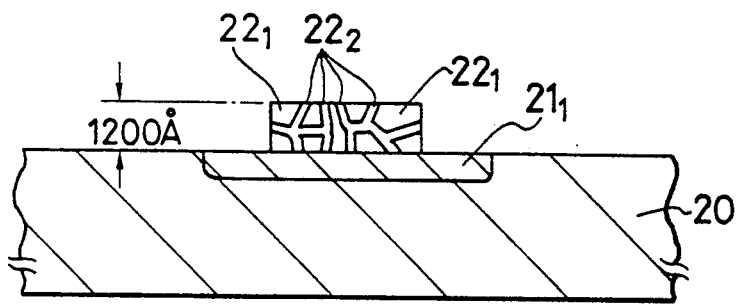

In FIG. 2b, a nitride of a high melting point metal such as tungsten nitride WNx is deposited a thickness of approximately 500 Å, 1200 Å or 4000 Å, as hereinafter described in detail, over the entire surface of the substrate 20 by, e.g., a sputtering. A patterned resist mask (not shown) is mounted on the surface of the substrate 20, and a reactive ion etching of the tungsten nitride is carried out using CF$_4$ etching gas to form a gate metal or gate electrode $22_1$ on the active region $21_1$. This gate electrode $22_1$ extends 15000 Å long in a direction parallel with a channel length direction and 40000 Å long in another direction perpendicular thereto, as shown in FIG. 2g. Thus the obtained tungsten nitride gate electrode $22_1$ is a polycrystal having crystal grain boundaries $22_2$ therein.

Figure 2C:
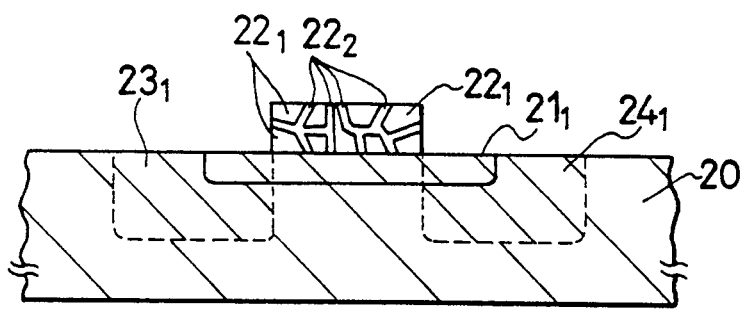

In FIG. 2c, after removing the resist mask, by using a resist mask having open windows in both sides of the gate electrode $22_1$ for forming source and drain regions, the silicon ion is implanted into the substrate 20, for example, at 120 keV energy with a dose of $3 \times 10^{13}/cm^2$ to form impurity doping regions $23_1$ and $24_1$ self-aligning to the gate electrode $22_1$.

Figure 2D:
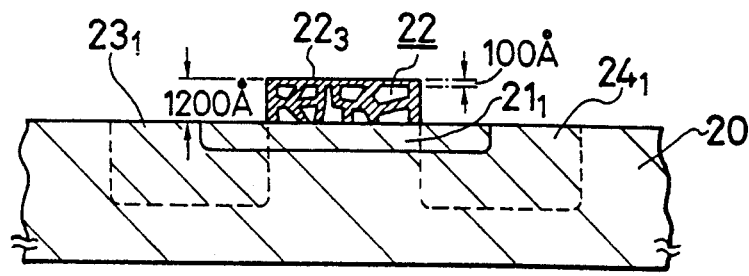
Figure 2E:
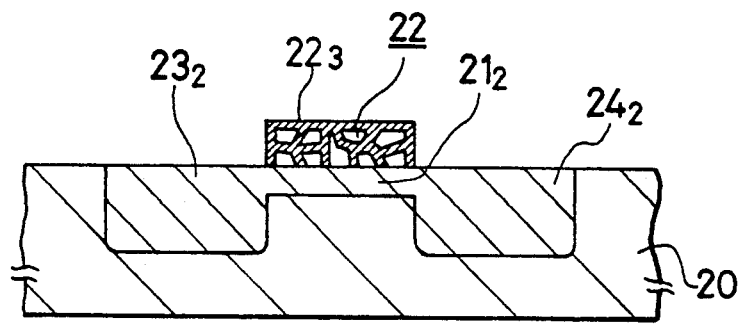

In FIG. 2d, a thermal oxidation of the gate electrode 22, is carried out, e.g., in one ε. tm of a mixture gas atmosphere of oxygen and nitrogen at a flowing amount ratio of ¼, such as the air at a low temperature of approximately 350° C. In this thermal oxidation, the surface of the gate electrode $22_1$ is deposited with an extremely thin oxide film $22_3$ of the tungsten nitride with approximately 50 Å to 100 Å thickness, and oxygen atoms are diffused into the crystal grain boundaries to form oxide films therein, thereby obtaining a coated gate electrode 22. In this embodiment, the film thickness of the coated gate electrode 22 can not be changed by the oxidation. In such a low temperature, no disorder of the interface between the gate electrode $22_1$ and the active region $21_1$ due to a thermal diffusion caused therebetween, arises, and hence its Schottky characteristics can be maintained well after the thermal treatment.

In this thermal treatment, even when the nitrogen amount with respect to the oxygen amount is considerably increased, the oxide film $22_3$ can be formed. For forming the oxide film $22_3$, at least 250° C. of the heat treatment temperature is required, and for preventing the deterioration of the Schottky characteristics, at most 600° C. of the heat treatment temperature is preferable and more preferable at most 450° C.

In this case, although the oxide film $22_3$ is formed by the thermal oxidation, for instance, a plasma oxidation method using the oxygen plasma generated by discharging electricity in the oxygen gas of a low temperature of 80° C. in a flowing amount of 100 ml/min at 0.5 Torr, may be applied for forming the oxide film $22_3$. Alternatively, an ozone oxidation method performed in ozones (O$_3$) and oxygen radicals can be also applicable. That is, any method which is capable of conducting at a low temperature and maintaining the Schottky characteristics after the oxidation, may be used for forming the oxide film $22_3$.

In the above embodiment, although the mixture gas of the oxygen and nitrogen gases is used, only the oxygen gas or ozone gas may be used, or a mixture gas of oxygen or ozone gas and an inert gas such as nitrogen or argon gas may be employed. Further, the air may be used as the oxidation gas, and the plasma oxidation and the ozone oxidation as well.

After the thermal treatment, a cleaning may be carried out, if necessary, before the following step, and in this cleaning step, the surface of the gate electrode can not be changed, but the oxidized materials on the surface of the GaAs substrate 20 may be removed.

In FIG. 2c, in order to activate the impurity doping regions $23_1$ and $24_1$, they are treated in one atm of the AsH$_3$+Ar mixture gas atmosphere at a high temperature of approximately 820° C. for 20 minutes to form n$^+$-type source and drain regions $23_2$ and $24_2$, respectively, and the active region $21_1$ is also formed as the channel region $21_2$ at the same time. In this step, the oxide film $22_3$ formed on the surface and in the crystal grain boundaries of the gate electrode 22 prevent the elements having a high vapor pressure such as As from releasing from the channel region $21_2$ to the atmosphere through the gate electrode 22, thereby preventing the crystalization disorder in the channel region $21_2$ of the interface between the gate electrode 22 and the channel region $21_2$. In this high temperature thermal treatment, for effective and well activating the implanted impurities, at least 750° C. is preferably necessary and at least 300° C. is more preferable.

Figure 2F:
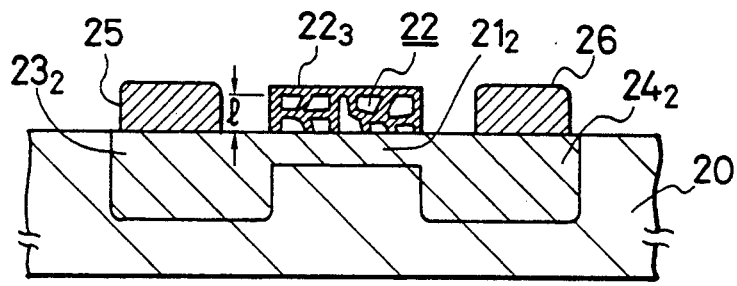
Figure 2G:
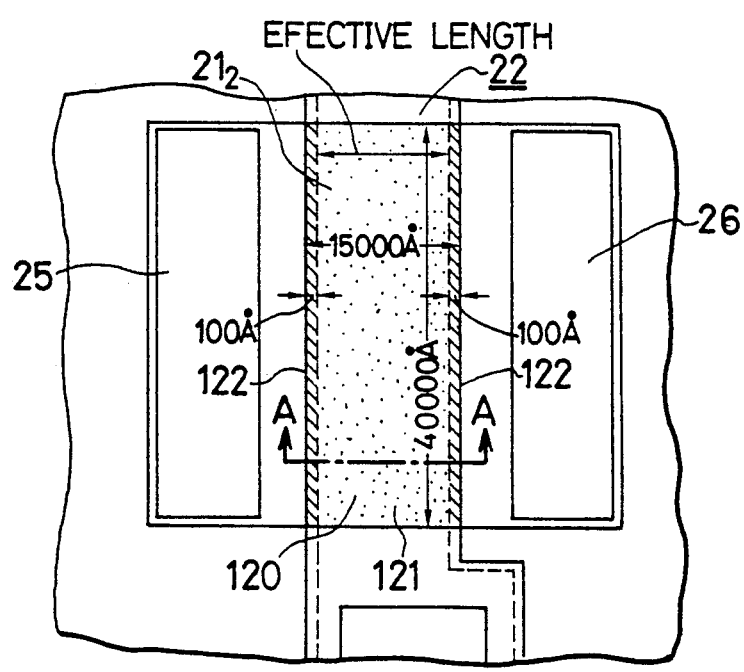

In FIG. 2f, lastly, the entire surface of the substrate 20 including the gate electrode 22 is covered by an insulating film (not shown), and open windows are formed in the insulating film above the source and drain regions $23_2$ and $24_2$. Then, a pair of AuGe/Au source and drain electrodes 25 and 26 are formed by a lift-off method. That is, an AuGe/Au (from underside) two-layer film is formed in the open windows and on the insulating film of the substrate 20, and the insulating film is removed together with the unneccessary portions of the AuGe-/Au film.

In this case, for mounting a wiring to the gate electrode 22, even when the thickness of the oxide film $22_3$ covering the gate electrode $22_1$ is approximately 100 to 200 Å, since a Ti wiring layer (not shown) is a sufficiently reactive metal, and the wiring layer can readily pass through the oxide film to contact well with the tungsten nitride WNx film. Hence, there is no need to positively remove the oxide film $22_3$ on the surface of the gate electrode 22 by etching. When the thickness of the oxide film $22_3$ of the gate electrode 22 is larger than 100 to 200 Å, the oxide film $22_3$ may be removed by etching as occasion demands. For instance, a Tl/Pt/Au (from underside) three-layer film may be contacted to the gate electrode.

Although the tungsten nitride film is processed to be the gate electrode and then the succesive process of the ion implantation to the oxidation to the high temperature thermal treatment is carried out to form the activated source and drain regions, however, it is necessary to form the oxide film $22_3$ for covering the gate electrode 22 in a low temperature thermal treatment before conducting the high temperature thermal treatment, and thus a succesive process of an oxidation to an ion implantation to a high temperature thermal treatment may also be possible. FIG. $2g$ is a top plan view of the MESFET shown in FIG. $2f$.

Then, the proper oxidation of the surface of the gate electrode 22 for forming a MESFET having a good Schottky characteristics will now be described.

Figure 3:
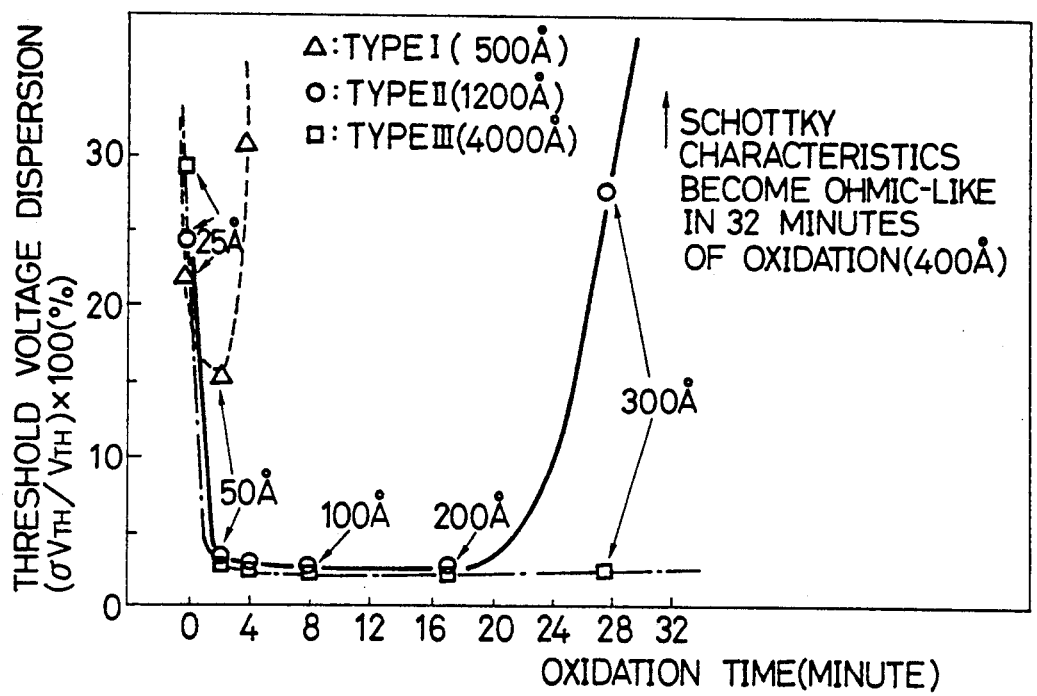
FIG. 3 is a graphical representation showing a threshold voltage dispersion with respect to an oxidation time in the MESFET produced by the process shown in FIG. 2.

In FIG. 3, there are shown a threshold voltage dispersion with respect to an oxidation time in the MESFETs produced by the process shown in FIG. 2. In this case, threshold voltages Vth of the MESFETs formed on the same wafer at a fixed temperature of 350° C. for a variation time of 0 to 32 minutes in the oxidation process, are measured, and Types I, II and III having gate electrode thicknesses of 500 Å, 1200 Å and 4000 Å, respectively, are represented by --△--, —◯— and --☐---, respectively. In FIG. 3, the thicknesses of the oxide films detected by the Auger analysis method are indicated together with the measured data with respect to the oxidation time.

In FIG. 3, it is understood from the results of the type I and the type II that, when no surface oxidation treatment is carried out, the dispersion of the threshold voltages Vth is at least 20%, and that, when the surface oxidation treatment is performed for at least 2 minutes with an oxide film having at least 50 Å thickness, the dispersion of the threshold voltages Vth is reduced. In particular, when the surface oxidation treatment is conducted for at least 8 minutes with an oxide film having at least 100 Å thickness, the dispersion is reduced to at most 3% which is at most one sixth of that resulted by no surface oxidation treatment. Even when no surface oxidation treatment is carried out, an oxide film of 25 Å thickness exists, which is formed by a natural oxidation.

From these results, for obtaining a good cap effect, the oxide film is preferably required at least 50 Å of thickness, and more preferably at least 100 Å of thickness.

Then, the surface oxidation limit of the gate electrode will now be described.

As apparent from the data of Type II, the dispersion can be restrained when the oxidized thickness is up to 200 Å (1000 Å thickness is not oxidized), but, when the oxidized thickness is beyond 400 Å (800 Å thickness is not oxidized), the Schottky barrier of the gate electrode can be completely broken to exhibit an ohmic nature. As apparent from the data of Type I, when the thickness of the gate from the data of Type I, when the thickness of the gate electrode is less than 1000 Å, for example, 500 Å, the dispersion can not be reduced by the surface oxidation treatment. That is, when the thickness of the gate electrode is thinned to a certain extent, in practice, no MESFET can be produced according to the present method.

From the results of Type I and Type II, the following can be found. That is, in the gate electrode 22, as shown in FIG. $2f$, a non-oxidized thickness 1 from the Schottky interface is required at least 1000 Å. As apparent from the experiment results, as more than 1000 Å of thickness is oxidized, the oxygen reaching the Schottky interface through the crystal grain boundaries increases, and by the reached oxygen, the tungsten nitride of the gate electrode can be reacted with the GaAs substrate, resulting in that the Schottky barrier height is reduced.

In the description in connection with FIG. 3, the term "oxide film" is a meaning of the oxide film of the gate electrode material such as WNx, i.e., a layer formed on the surface of the gate electrode, but does not mean portions including oxygen atoms in the WNx crystal grain boundaries within the gate electrode.

The oxidizable range is determined in this way, and the better formation can be realized by adding the following condition. That is, the oxide films are formed on the sides of the gate electrode, and the effective length of the gate electrode is somewhat reduced.

In FIG. $2g$, a channel layer surface 120 having an area $S_0$ is the sume of a spotted region 121 having an area $S_1$ and slant line regions 122 having an area $S_2$. A value $S_1/S_0$ is 99% and a good MESFET can be obtained by this value. In general, in the slant line regions 122 where the oxide portions of the gate electrode 22 contact with the channel layer surface 120, the Schottky interface is disordered, and thus the regions 122 are preferably as small as possible. That is, $S_1/S_0$ approaches 100%, the better result can be obtained in the light of the prevention of the Schottky barrier deterioration for the gate electrode 22 itself. When $S_1/S_0$ is at least 99%, the Schottky barrier deterioration becomes negligibly small, which is more preferable. As $S_1/S_0$ is reduced, the ohmic nature exhibited in the gate electrode increases, and the gate electrode becomes improper to the Schottky gate electrode.

Figure 4A:
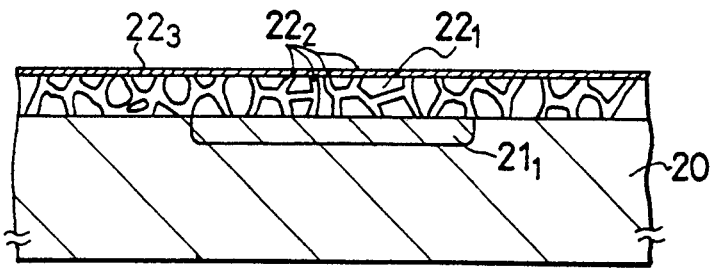
FIGS. 4(a)-4(b) are cross sectional views of another embodiment of a method for producing another GaAs MESFET according to the present invention.
Figure 4B:
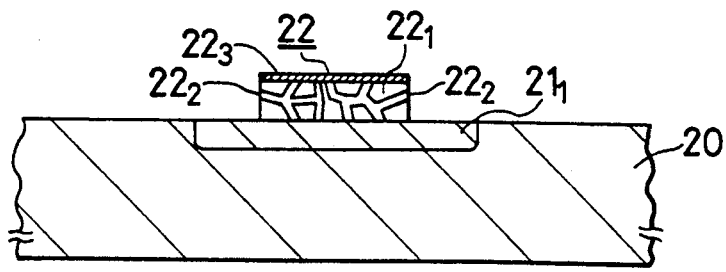

In FIG. 4, there is shown another embodiment of a method for producing another metal-semiconductor device such as another MESFET according to the present invention.

In this embodiment, after the tungsten nitride film WNx is formed on the CaAs substrate 20 including the active region $21_1$ in its surface portion, the thermal treatment for the surface oxidation is carried out before the tungsten nitride film is processed to the gate electrode.

In FIG. $4a$, the active region $21_1$ is firstly formed on the CaAs substrate 20 in the same manner as that shown in FIG. $2a$. Then, the WNx gate metal $22_1$ is deposited a thickness of approximately 500 Å, 1200 Å or 4000 Å over the entire surface of the substrate 20 in the same manner as the first embodiment described above. The thermal treatment of the surface of the gate metal $22_1$ is carried out in the air at approximately 350° C. for 8 minutes to form the oxide film $22_3$ of approximately 50 Å to 100 Å thickness.

In FIG. $4b$, the gate metal $22_1$ is selectively treated by an anisotropic etching to form the gate electrode 22 on the active region $21_1$.

Then, the substrate 20 having the gate electrode 22 is processed in the same manner as shown in FIGS. $2c$ to 2f to obtain a MESFET of the present invention. In this method, the gate electrode 22 having no oxide films on both sides is thermally treated for annealing, and no Schottky barrier deterioration is substantially observed. It is considered that the release of the elements having a high vapor pressure such as As may be negligibly small.

In this embodiment, since the both the sides of the gate electrode 22 is not oxidized, the value $S_1/S_0$ becomes substantially 100% (no slant line region exists), there is no problem of the Schottky barrier deterioration due to the oxidations from both the sides, i.e., the gate length is not changed. The oxide films can be considered according to the results shown in FIG. 3 and can be determined only the the thickness of the surface oxide film of the gate electrode and the thickness of the non-oxidized portion from the Schottky interface.

The present invention may be widely applied to a method in which a high temperature thermal treatment is carried out after forming a Schottky electrode on a metal-semiconductor field-effect transistor or diode. For example, an n-type active region is formed on a CaAs substrate, and a Schottky electrode as an anode is formed on the active region. Then, an activated n+-type impurity region as a cathode is formed to obtain a Schottky junction diode, according to the present invention. In this case, a thermal treatment of the substrate is carried out in an oxidation atmosphere, as described above, before the n-type impurity region is activated by the high temperature thermal treatment to activate the impurity region.

The present invention may be applied to another metal-semiconductor such as InP, GdTe or the like, and instead of the tungsten nitride, high melting point metals such as titanium, molybdenum, tantalum and the like, or nitrides, silicides, siliconitrides and the like thereof may be applied.

It is readily understood that according to the present invention the Schottky characteristics deterioration can be prevented when the high temperature thermal treatment is conducted and the Schottky characteristics can be well maintained accordingly, thereby improving the productivity of the MESFETs.

Although the present invention has been described in its preferred embodiments with reference to the accompanying drawings, it is readily understood that the present invention is not restricted to the preferred embodiments and that various changes and modifications may be made in the present invention by a person skilled in the art without departing from the spirit and scope of the present invention.

What is claimed is:

1. A method of producing a semiconductor device, comprising the steps of:
    forming exposed and unexposed areas on a gallium arsenide substrate by forming a refractory metal layer on a portion of the gallium arsenide substrate to form a Schottky junction between the refractory metal layer and the gallium arsenide substrate;
    oxidizing the refractory metal layer in a gas containing oxygen; and
    carrying out capless annealing of the gallium arsenide substrate having the oxidized refractory metal layer thereon in an atmosphere containing arsenic.

2. The method of claim 1, wherein the oxygen-containing gas is selected from the group consisting of $O_2$ gas, $O_3$ gas, a mixture of $O_2$ gas and an inert gas, a mixture of $O_2$ gas and $N_2$ gas, a mixture of $O_3$ gas and an inert gas and a mixture of $O_3$ gas and $N_2$ gas.

3. The method of claim 1, wherein the oxidizing step is carried out one of thermal oxidation and plasma oxidation.

4. The method of claim 1, wherein the oxidizing step forms an oxide film having a first thickness on an upper surface of the metal layer, a second thickness of said metal layer adjacent said gallium arsenide substrate remaining unoxidized.

5. The method of claim 4, wherein the first thickness is at least about 50 Å and the second thickness is at least about 1000 Å.

6. The method of claim 4, wherein the first thickness is at least about 100 Å and the second thickness is at least about 1000 Å.

7. The method of claim 1, wherein the metal layer is selected from the group consisting of nitrides, silicides and silicon nitrides of a high melting point metal.

8. The method of claim 7, wherein the refractory metal layer is tungsten nitride.

9. The method of claim 1, additionally comprising the step of patterning the metal layer before oxidizing.

10. The method of claim 1, additionally comprising the step of patterning the metal layer after oxidizing.

11. A method of producing a semiconductor device, comprising the steps of:
    forming exposed and unexposed areas on a gallium arsenide substrate by sputtering a refractory metal layer on a portion of the gallium arsenide substrate to form a Schottky junction between the refractory metal layer and the gallium arsenide substrate;
    thermally oxidizing the refractory metal layer in a gas containing oxygen; and
    carrying out capless annealing of the gallium arsenide substrate having the oxidized refractory metal layer thereon in an atmosphere containing arsenic.

12. The method of claim 11, wherein the oxygen-containing gas is selected from the group consisting of $O_2$ gas, $O_3$ gas, a mixture of $O_2$ gas and an inert gas, a mixture of $O_2$ gas and $N_2$ gas, a mixture of $O_3$ gas and an inert gas and a mixture of $O_3$ gas and $N_2$ gas.

13. The method of claim 11, wherein the oxidizing step forms an oxide film having a first thickness on an upper surface of the refractory metal layer, a second thickness of said refractory metal layer adjacent said gallium arsenide substrate remaining unoxidized.

14. The method of claim 13, wherein the first thickness is at least about 50 Å and the second thickness is at least about 1000 Å.

15. The method of claim 13, wherein the first thickness is at least about 100 Å and the second thickness is at least about 1000 Å.

16. The method of claim 11, wherein the refractory metal layer is selected from the group consisting of nitrides, silicides and silicon nitrides of a high melting point metal.

17. The method of claim 16, wherein the refractory metal layer is tungsten nitride.

18. The method of claim 11, additionally comprising the step of patterning the refractory metal layer before oxidizing.

19. The method of claim 11, additionally comprising the step of patterning the refractory metal layer after oxidizing.

20. A method of producing a semiconductor device, comprising the steps of:

sputtering a refractory metal layer on a gallium arsenide substrate to form a Schottky junction therebetween;

oxidizing by one of thermal oxidation and plasma oxidation the surface of the refractory metal layer to produce a structure comprising a layer of oxidized refractory metal layer overlying a layer of unoxidized refractory metal layer adjacent the gallium arsenide substrate; and carrying out capless annealing of the gallium arsenide substrate having the oxidized refractory metal layer thereon in an atmosphere containing arsenic.

21. The method of claim 20, wherein the oxygen-containing gas is selected from the group consisting of $O_2$ gas, $O_3$ gas, a mixture of $O_2$ gas and an inert gas, a mixture of $O_2$ gas and $N_2$ gas, a mixture of $O_3$ gas and an inert gas and a mixture of $O_3$ gas and $N_2$ gas.

22. The method of claim 20, wherein the oxidizing step forms an oxide film having a first thickness on an upper surface of the refractory metal layer, a second thickness of said refractory metal layer adjacent said gallium arsenide substrate remaining unoxidized.

23. The method of claim 22, wherein the first thickness is at least about 50 Å and the second thickness is at least about 1000 Å.

24. The method of claim 22, wherein the first thickness is at least about 100 Å and the second thickness is at least about 1000 Å.

25. The method of claim 20, wherein the refractory metal layer is selected from the group consisting of nitrides, silicides and silicon nitrides of a high melting point metal.

26. The method of claim 25, wherein the refractory metal layer is tungsten nitride.

27. The method of claim 20, additionally comprising the step of patterning the refractory metal layer before oxidizing.

28. The method of claim 11, additionally comprising the step of patterning the refractory metal layer after oxidizing.

29. A method of producing a semiconductor device, comprising the steps of:
(a) forming a layer of refractory metal on a gallium arsenide substrate containing a first impurity doped region;

(b) oxidizing the surface of the layer of refractory metal in a gas containing oxygen to produce a structure comprising an oxidized refractory metal layer overlying an unoxidized refractory metal layer that is adjacent the first impurity doped region;

(c) patterning said refractory metal to produce a gate over said first impurity doped region;

(d) producing second and third impurity doped regions on either side of and aligned with said gate; and (e) after said oxidizing step, carrying out capless annealing in an atmosphere containing arsenic to activate said first region to form a channel region, said second region to form a source region and said third region to form a drain region, wherein said oxidized layer prevents crystallization disorder in the channel region.

30. The method of claim 29, wherein the oxidized refractory metal layer is at least about 50 Å and the unoxidized refractory metal layer is at least about 1000 Å.

31. The method of claim 29, wherein the oxidized refractory metal layer is at least about 100 Å and the unoxidized refractory metal layer is at least about 1000 Å.

32. The method of claim 29, wherein the recited steps are in the order (a), (b), (c), (d) and then (e).

33. The method of claim 29, wherein the recited steps are in the order (a), (c), (b), (d) and then (e).

34. A method of producing a semiconductor device, comprising the steps of:

forming a refractory metal layer on a gallium arsenide substrate to form a Schottky junction therebetween;

oxidizing the refractory metal layer in a gas containing oxygen;

patterning the refractory metal layer to produce an exposed surface of the gallium arsenide substrate; and carrying out capless annealing of the gallium arsenide substrate having the oxidized refractory metal layer thereon and the exposed surface in an atmosphere containing arsenic.

* * * * *